United States Patent
Zhang

(10) Patent No.: US 11,689,158 B2
(45) Date of Patent: Jun. 27, 2023

(54) APPARATUS FOR INJECTING ENERGY INTO CRYSTAL IN CRYSTAL OSCILLATOR, AND CRYSTAL OSCILLATOR

(71) Applicant: SHENZHEN GOODIX TECHNOLOGY CO., LTD., Shenzhen (CN)

(72) Inventor: Mengwen Zhang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/510,081

(22) Filed: Oct. 25, 2021

(65) Prior Publication Data

US 2022/0103126 A1   Mar. 31, 2022

Related U.S. Application Data

(63) Continuation of application No. PCT/CN2020/118745, filed on Sep. 29, 2020.

(51) Int. Cl.
*H03B 5/32* (2006.01)
*H03B 5/08* (2006.01)

(52) U.S. Cl.
CPC ............... *H03B 5/32* (2013.01); *H03B 5/08* (2013.01); *H03B 2200/0094* (2013.01)

(58) Field of Classification Search
CPC ........................................ H03B 5/32
USPC ............................................. 331/50
See application file for complete search history.

(56) References Cited

U.S. PATENT DOCUMENTS

| 10,848,102 | B2 | 11/2020 | Zhang | |
| 2007/0296512 | A1 | 12/2007 | Yokoyama et al. | |
| 2016/0105147 | A1 | 4/2016 | Matsuo et al. | |
| 2019/0288644 | A1 | 9/2019 | Zhang | |
| 2020/0099337 | A1* | 3/2020 | Powell | H03L 7/08 |
| 2020/0244220 | A1 | 7/2020 | Van Der Zee et al. | |
| 2021/0305939 | A1* | 9/2021 | Carlton | H03B 5/06 |

FOREIGN PATENT DOCUMENTS

| CN | 101015117 A | 8/2007 |
| CN | 101093976 A | 12/2007 |
| CN | 102684601 A | 9/2012 |
| CN | 108401476 A | 8/2018 |
| CN | 108781056 A | 11/2018 |
| CN | 109845092 A | 6/2019 |

* cited by examiner

*Primary Examiner* — Joseph Chang

(57) ABSTRACT

Embodiments of the present application provide an apparatus for injecting energy into a crystal in a crystal oscillator, and a crystal oscillator. The apparatus includes: a crystal; a voltage-controlled oscillator configured to output an oscillation signal to the crystal; a ramp voltage generating circuit configured to generate a ramp voltage that changes over time; a first switch disposed between the ramp voltage generating circuit and the voltage-controlled oscillator; a first capacitor, where a first terminal of the first capacitor is connected to the first switch and the voltage-controlled oscillator, and a second terminal of the first capacitor is grounded; and a control circuit configured to control a status of the first switch according to a current through the crystal. Therefore, the apparatus can efficiently inject energy into the crystal.

11 Claims, 6 Drawing Sheets

APPARATUS FOR INJECTING ENERGY INTO CRYSTAL IN CRYSTAL OSCILLATOR, AND CRYSTAL OSCILLATOR

CROSS-REFERENCE TO RELATED APPLICATIONS

This application is a continuation of International Application No. PCT/CN2020/118745, filed on Sep. 29, 2020, the disclosure of which is hereby incorporated by reference in its entirety.

TECHNICAL FIELD

Embodiments of the present application relate to the field of electronic components, and more specifically, to an apparatus for injecting energy into a crystal in a crystal oscillator, and a crystal oscillator.

BACKGROUND

To improve a startup speed of a crystal oscillator, a swept-frequency clock is usually used to inject a specific amount of energy into a crystal in advance. However, due to a very high quality factor of the crystal, the energy can be effectively injected into the crystal only when an injection frequency is very close to a resonant frequency of the crystal. When the injection frequency is far from the resonant frequency of the crystal, the energy is not effectively injected, and existing energy is consumed. Therefore, how to efficiently inject energy into the crystal to implement fast startup of the crystal oscillator is an urgent problem to be resolved.

SUMMARY

The present application provides an apparatus for injecting energy into a crystal in a crystal oscillator, and a crystal oscillator, to efficiently inject energy into a crystal.

According to a first aspect, an apparatus for injecting energy into a crystal in a crystal oscillator is provided. The apparatus includes: a crystal; a voltage-controlled oscillator configured to output an oscillation signal to the crystal; a ramp voltage generating circuit configured to generate a ramp voltage that changes over time, so as to control a frequency of the oscillation signal output by the voltage-controlled oscillator; a first switch disposed between the ramp voltage generating circuit and the voltage-controlled oscillator; a first capacitor, where a first terminal of the first capacitor is connected to the first switch and the voltage-controlled oscillator, and a second terminal of the first capacitor is grounded; and a control circuit configured to control a status of the first switch according to a current through the crystal, to switch a control voltage of the voltage-controlled oscillator.

Therefore, in the apparatus for injecting energy into a crystal in a crystal oscillator in this embodiment of the present application, the control circuit detects the current through the crystal, and when the current through the crystal reaches a specific value, controls the control voltage of the voltage-controlled oscillator to switch from the voltage output by the ramp voltage generating circuit to a specific voltage, so that the frequency of the oscillation signal output by the voltage-controlled oscillator is close to a resonant frequency of the crystal. This ensures that energy of the crystal is large enough to improve a startup speed of the crystal oscillator.

With reference to the first aspect, in an implementation of the first aspect, the control circuit is specifically configured to: control the first switch to change from an on state to an off state when the current through the crystal reaches a maximum value.

With reference to the first aspect and the foregoing implementation of the first aspect, in another implementation of the first aspect, the control circuit includes: a resistor, where a first terminal of the resistor is connected to the crystal, a second terminal of the resistor is grounded, and the resistor is configured to convert the current through the crystal into a voltage across the resistor; an envelope tracking circuit configured to detect an envelope voltage of the voltage across the resistor; a peak detection circuit configured to detect a peak voltage of the envelope voltage; a hysteresis comparator, where a first input terminal of the hysteresis comparator is configured to obtain the envelope voltage, a second input terminal of the hysteresis comparator is configured to obtain the peak voltage, an output terminal of the hysteresis comparator is connected to a logic control circuit, and the hysteresis comparator is configured to output a comparison result to the logic control circuit according to the envelope voltage and the peak voltage; and the logic control circuit configured to control the status of the first switch according to the comparison result.

With reference to the first aspect and the foregoing implementations of the first aspect, in another implementation of the first aspect, the control circuit further includes: a capacitance cancellation circuit configured to cancel a current through a shunt capacitor included in the crystal.

With reference to the first aspect and the foregoing implementations of the first aspect, in another implementation of the first aspect, the capacitance cancellation circuit is connected in parallel to the crystal, and the capacitance cancellation circuit includes: a voltage-controlled voltage source configured to duplicate and output a voltage across the crystal; a preset capacitor, where the preset capacitor is connected in series to the voltage-controlled voltage source, and a capacitance of the preset capacitor is equal to a capacitance of the shunt capacitor; and a current-controlled current source, where the current-controlled current source is connected in series to the preset capacitor, and the current-controlled current source is configured to duplicate and output a current through the preset capacitor to cancel the capacitance of the shunt capacitor.

With reference to the first aspect and the foregoing implementations of the first aspect, in another implementation of the first aspect, the envelope voltage is a positive envelope voltage.

With reference to the first aspect and the foregoing implementations of the first aspect, in another implementation of the first aspect, if the peak voltage is less than or equal to a sum of the envelope voltage and a hysteresis voltage, the comparison result output by the hysteresis comparator is a first value; or if the peak voltage is greater than a sum of the envelope voltage and a hysteresis voltage, the comparison result output by the hysteresis comparator is a second value.

With reference to the first aspect and the foregoing implementations of the first aspect, in another implementation of the first aspect, when the first switch is in the on state, the ramp voltage generating circuit starts to output the ramp voltage, and the logic control circuit is configured to: control the first switch to maintain the on state if the hysteresis comparator outputs the first value at a first moment; and control the first switch to change from the on state to the off state if the hysteresis comparator outputs the second value at a second moment, so that the control voltage of the voltage-controlled oscillator is switched from the ramp voltage to a voltage across the first capacitor, where the second moment is later than the first moment.

With reference to the first aspect and the foregoing implementations of the first aspect, in another implementation of the first aspect, the apparatus further includes a second switch and a second capacitor. The second switch is disposed between the first terminal of the first capacitor and a first terminal of the second capacitor, and a second terminal of the second capacitor is grounded. The logic control circuit is further configured to control a status of the second switch according to the comparison result.

With reference to the first aspect and the foregoing implementations of the first aspect, in another implementation of the first aspect, a capacitance of the second capacitor is equal to a capacitance of the first capacitor.

With reference to the first aspect and the foregoing implementations of the first aspect, in another implementation of the first aspect, when the first switch and the second switch are in the on state, the ramp voltage generating circuit starts to output the ramp voltage, and the logic control circuit is configured to: control the first switch and the second switch to maintain the on state if the hysteresis comparator outputs the first value at a third moment; control the first switch to maintain the on state and the second switch to change from the on state to the off state if the hysteresis comparator outputs the second value at a fourth moment, where the fourth moment is later than the third moment; and control the first switch to change from the on state to the off state and the second switch from the off state to the on state if the hysteresis comparator outputs the second value at a fifth moment, so that the control voltage of the voltage-controlled oscillator is switched from the ramp voltage to an average voltage, where the average voltage is an average of a voltage across the first capacitor and a voltage across the second capacitor, the fifth moment is later than the fourth moment, and the first switch is in the on state and the second switch is in the off state from the fourth moment to the fifth moment.

According to a second aspect, a crystal oscillator is provided. The crystal oscillator includes the crystal in the apparatus according to the first aspect or any possible implementation of the first aspect; and an oscillating circuit.

DETAILED DESCRIPTION OF THE EMBODIMENTS

Figure 1:
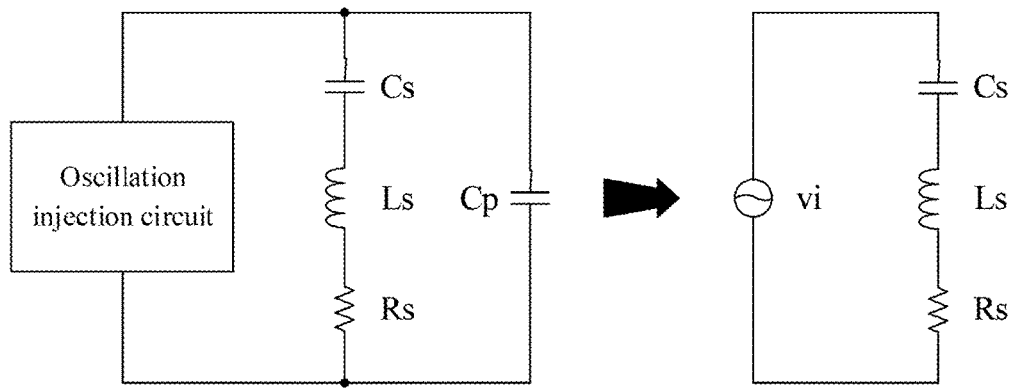
FIG. 1 is a schematic diagram of injecting energy into a crystal in a crystal oscillator according to an embodiment of the present application.

FIG. 1 shows a circuit for injecting energy into a crystal in a crystal oscillator and a corresponding equivalent circuit. A circuit diagram for injecting energy into the crystal by an oscillation injection circuit is shown on the left side of FIG. 1. An equivalent circuit of the crystal may include a capacitor Cs, an inductor Ls, and a resistor Rs connected in series, and a capacitor Cp in parallel. An equivalent circuit diagram for injecting energy into the crystal by the oscillation injection circuit is shown on the right side of FIG. 1. Injecting energy into the crystal can be equivalent to using the oscillation injection circuit to increase a current through the capacitor Cs or inductor Ls in the crystal.

As shown in FIG. 1, assuming that a sinusoidal signal is injected, an expression of the current through the inductor Ls in the Laplace domain is as follows:

$$I(s) = \frac{v_i \omega_i}{s^2 + \omega_i^2} \cdot \frac{1}{sL + \frac{1}{sC} + R} \tag{1}$$

where $v_i$ represents a voltage amplitude of the injected signal, $\omega_i$ represents a frequency of the injected signal, s represents a Laplace operator, L represents an inductance of the inductor Ls included in the crystal, C represents a capacitance of the capacitor Cs included in the crystal, and R represents a resistance of the resistor Rs included in the crystal.

In addition, assuming that a resonant frequency of an LC circuit in the crystal is $\omega_s$, a quality factor Q of the crystal can be expressed as follows:

$$Q = \frac{\omega_s L}{R} = \frac{1}{\omega_s CR} \tag{2}$$

According to formula (2), R and C obtained by using formula (2) are substituted into formula (1), and the expression of the inductive current can be simplified as follows:

$$I(s) = \frac{v_i}{L} \cdot \frac{\omega_i}{s^2 + \omega_i^2} \cdot \frac{s}{s^2 + \frac{\omega_s s}{Q} + \omega_s^2} \tag{3}$$

Inverse Laplace transform is performed on the foregoing formula to obtain the following expression of the inductive current in time domain:

$$i_s t = \tag{4}$$
$$\frac{v_i}{L} \frac{1}{Q(\omega_s^2 - \omega_i^2)^2 + \omega_s^2 \omega_i^2} \left\{ \omega_i \left[ \omega_s \omega_i \sin(\omega_i t) + \frac{\omega_s^2 + \omega_i^2}{2} \sin(\omega_s t) e^{-\frac{\omega_s t}{2Q}} \right] - \omega_i (\omega_s^2 - \omega_i^2) Q \left[ \cos(\omega_s t) e^{-\frac{\omega_s t}{2Q}} - \cos(\omega_i t) \right] \right\}$$

Because the quality factor of the crystal is very high, generally 10,000 to 100,000, it can be assumed that Q is infinite, and formula (4) can be transformed as follows:

$$i_{s,Q\to\infty} t = -\frac{v_i}{L} \frac{\omega_i}{(\omega_s^2 - \omega_i^2)} [\cos(\omega_s t) - \cos(\omega_i t)] \tag{5}$$
$$= \frac{v_i}{L} \frac{2\omega_i}{(\omega_s^2 - \omega_i^2)} \sin(\omega_s t) \sin\left(\frac{\omega_s - \omega_i}{2} t\right)$$

Figure 2:
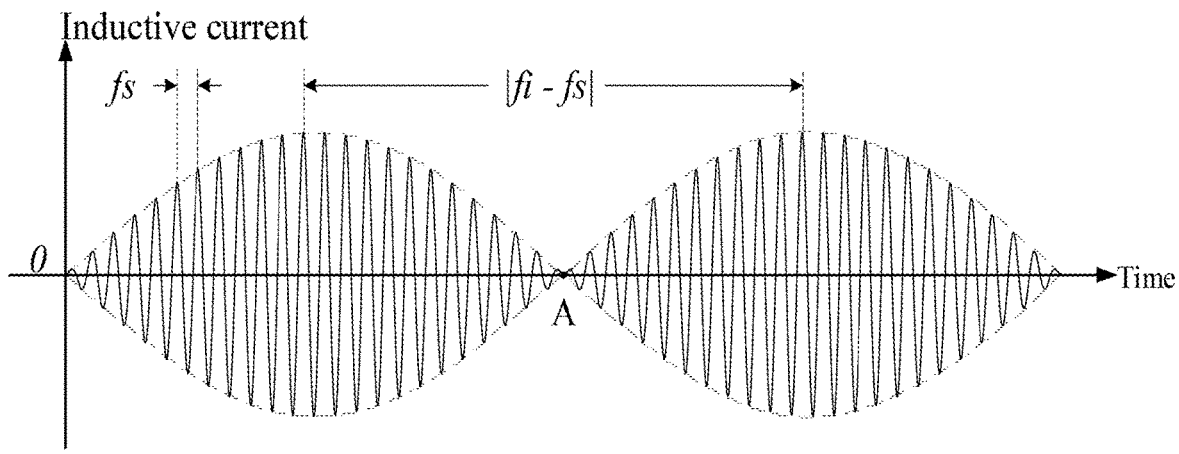
FIG. 2 is a curve diagram of an inductive current versus time according to an embodiment of the present application.

A waveform of formula (5) is shown in FIG. 2. It can be learned from FIG. 2 that a modulation frequency exists due to a deviation of the injection frequency and the resonant frequency. Therefore, there is a stagnation point, namely, point A in FIG. 2, every $1/|f_s - f_i|$, and all the previously injected energy disappears, where $\omega_i = 2\pi f_i$ and $\omega_s = 2\pi f_s$.

Figure 3:
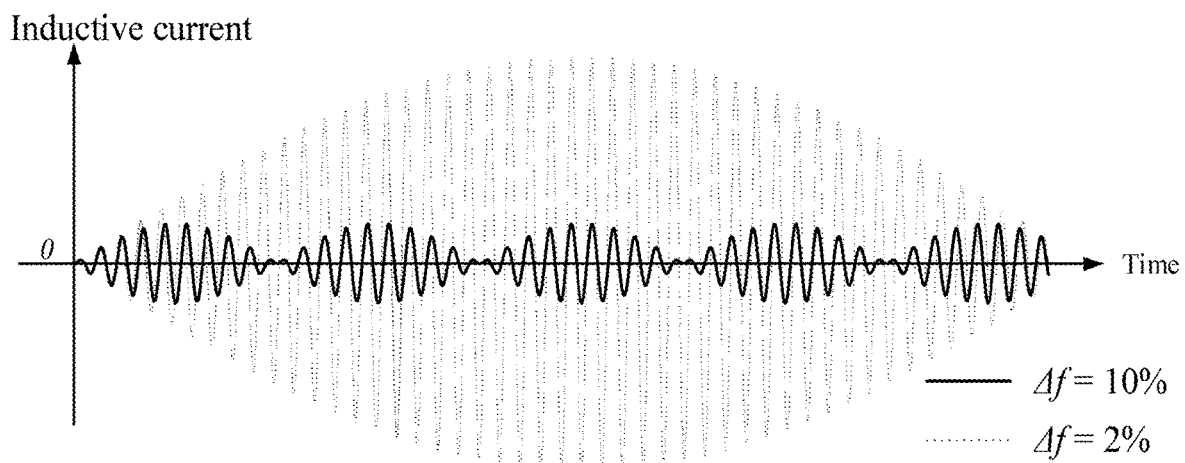
FIG. 3 is a comparison curve diagram of an inductive current versus different frequency differences according to an embodiment of the present application.

FIG. 3 shows waveforms of the inductive current for different frequency differences, where a solid curve represents $$\Delta f = \frac{|f_i - f_s|}{f_s} = 10\%,$$

and a dashed curve represents $$\Delta f = \frac{|f_i - f_s|}{f_s} = 2\%.$$

It can be learned from FIG. 3 that the smaller the frequency difference Δf, the greater an extremum enveloped by the current, that is, the larger the injected energy, and the shorter the time for the crystal oscillator to stably oscillate after entering a regular mode from a quick start mode.

When the frequency difference is almost zero, the expression of the inductive current can be simplified as follows:

$$i_{s,\omega_i\to\omega_s} = \frac{v_i}{R} \sin(\omega_s t) \left(1 + e^{-\frac{\omega_s t}{2Q}}\right) \tag{6}$$

It can be learned that when the injection frequency $f_i$ is very close to the resonant frequency $f_s$, the energy injected into the crystal exponentially increases over time.

Therefore, if the injection frequency can be close to the resonant frequency when energy is injected into the crystal, energy of the crystal can be maximized. An apparatus for injecting energy into a crystal in a crystal oscillator in the embodiments of the present application can resolve the problem of how to inject large energy into the crystal.

Figure 4:
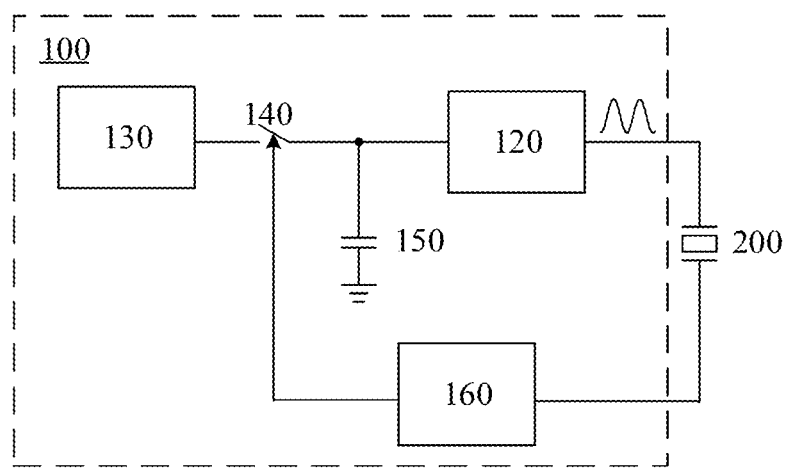
FIG. 4 is a schematic diagram of an apparatus for injecting energy into a crystal in a crystal oscillator according to an embodiment of the present application.

FIG. 4 is a schematic diagram of an apparatus 100 for injecting energy into a crystal in a crystal oscillator according to an embodiment of the present application. As shown in FIG. 4, the apparatus 100 includes a voltage-controlled oscillator 120, a ramp voltage generating circuit 130, a first switch 140, a first capacitor 150, and a control circuit 160.

Specifically, a crystal 200 in this embodiment of the present application may be a crystal in a crystal oscillator, so that the apparatus 100 injects energy into the crystal 200. For example, the voltage-controlled oscillator 120 may inject the energy into the crystal. To be specific, the voltage-controlled oscillator 120 is configured to output an oscillation signal to the crystal 200 to inject the energy into the crystal 200.

In this embodiment of the present application, the first switch 140 is disposed between the ramp voltage generating circuit 130 and the voltage-controlled oscillator 120. The ramp voltage generating circuit 130 is configured to generate a ramp voltage that changes over time, so as to control a frequency of the oscillation signal output by the voltage-controlled oscillator 120. For example, when the first switch 140 is in an on state, the ramp voltage generating circuit 130 is connected to the voltage-controlled oscillator 120, and the voltage output by the ramp voltage generating circuit 130 is used as an input control voltage of the voltage-controlled oscillator 120, so that the voltage-controlled oscillator 120 determines a frequency corresponding to the input voltage, and outputs the oscillation signal to the crystal 200 at the frequency.

In this embodiment of the present application, a first terminal of the first capacitor 150 is connected to the first switch 140 and the voltage-controlled oscillator 120, and a second terminal of the first capacitor 150 is grounded. For example, as shown in FIG. 4, if the first switch 140 is turned on, the voltage output by the ramp voltage generating circuit 130 can be used to charge the first capacitor 150. If the first switch 140 is turned off, a voltage across the capacitor 150 can be used as the control voltage of the voltage-controlled oscillator 120.

In this embodiment of the present application, the control circuit 160 is configured to control a status of the first switch 140 according to a current through the crystal 200, to switch the control voltage of the voltage-controlled oscillator 120. Specifically, the control circuit 160 may be configured to detect the current through the crystal 200, and control the first switch 140 to be turned on or off according to the current through the crystal 200, to switch the control voltage of the voltage-controlled oscillator 120. For example, in FIG. 4, if the control circuit 160 measures the current through the crystal 200 and controls the first switch 140 to be turned on, the voltage output by the ramp voltage generating circuit 130 is the control voltage of the voltage-controlled oscillator 120. If the control circuit 160 controls the first switch 140 to be turned off according to the current through the crystal 200, for example, when the current through the crystal 200 reaches a maximum value or a preset threshold, controls the first switch 140 to change from the on state to an off state, the control voltage of the voltage-controlled oscillator 120 is switched to the voltage across the first capacitor 150. Alternatively, when other circuits are included in the apparatus 100 in FIG. 4, the control voltage of the voltage-controlled oscillator 120 is switched to a voltage related to the voltage across the first capacitor 150. In this way, the voltage-controlled oscillator 120 outputs the oscillation signal to the crystal 200 at the frequency corresponding to the control voltage, so that the current through the crystal 200 can maintain the maximum value or the preset threshold.

Therefore, in the apparatus for injecting energy into a crystal in a crystal oscillator in this embodiment of the present application, the control circuit detects the current through the crystal, and when the current through the crystal reaches a specific value, controls the control voltage of the voltage-controlled oscillator to switch from the voltage output by the ramp voltage generating circuit to a specific voltage, so that the frequency of the oscillation signal output by the voltage-controlled oscillator is close to a resonant frequency of the crystal. This ensures that energy of the crystal is large enough to improve a startup speed of the crystal oscillator.

In this embodiment of the present application, as shown in FIG. 4, the control circuit 160 is configured to detect the current through the crystal 200. To make the energy injected into the crystal 200 reach the maximum value, an example in which the control circuit 160 is configured to detect whether the current through the crystal 200 reaches the maximum value is described herein. However, the embodiments of the present application are not limited thereto. For example, the control circuit 160 may alternatively be configured to detect whether the current through the crystal 200 reaches the preset threshold.

Figure 5:
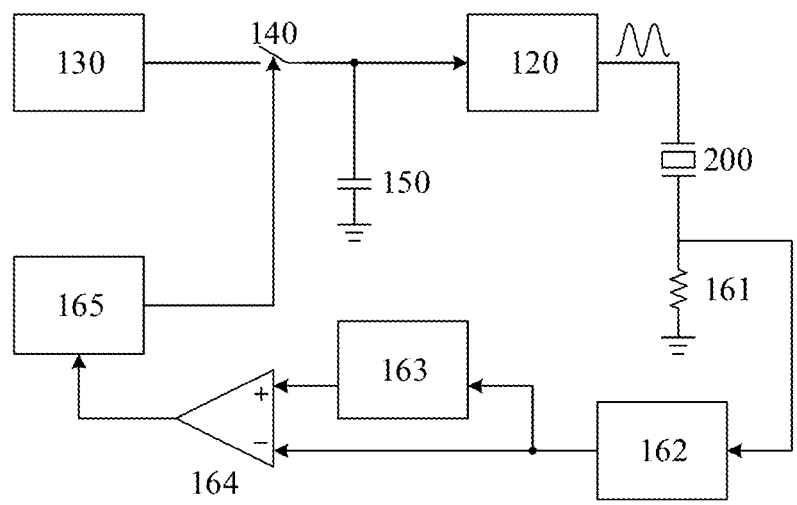
FIG. 5 is another schematic diagram of an apparatus for injecting energy into a crystal in a crystal oscillator according to an embodiment of the present application.
Figure 6:
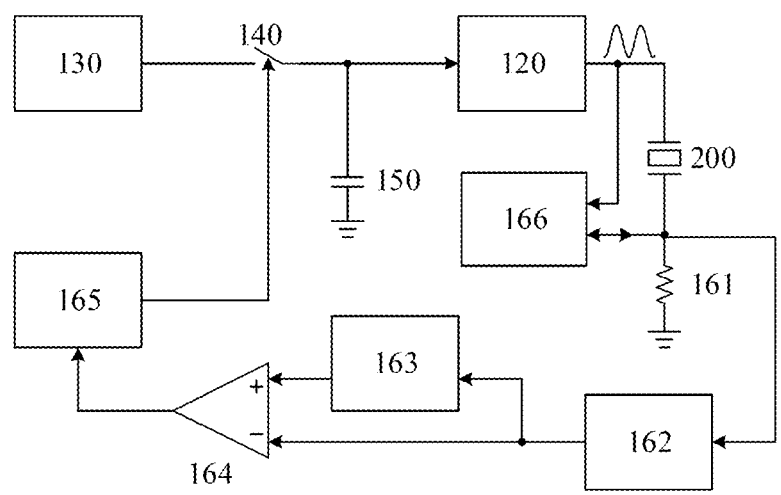
FIG. 6 is still another schematic diagram of an apparatus for injecting energy into a crystal in a crystal oscillator according to an embodiment of the present application.

When the control circuit 160 detects the current through the crystal 200, the control circuit 160 may be set according to actual application. For example, the control circuit 160 can convert detected current into detected voltage to detect a maximum current through the crystal 200. Optionally, FIG. 5 and FIG. 6 are schematic diagrams of the crystal 200 and the apparatus 100 including the control circuit 160 according to embodiments of the present application. As shown in FIG. 5, the control circuit 160 may include a resistor 161, an envelope tracking circuit 162, a peak detection circuit 163, a hysteresis comparator 164, and a logic control circuit 165.

Specifically, as shown in FIG. 5, a first terminal of the resistor 161 is connected to the crystal 200, and the second terminal of the resistor 161 is grounded. In this way, a voltage across the resistor 161 changes as the current through the crystal 200 changes. In other words, the current through the crystal 200 is proportional to the voltage across the resistor 161. Therefore, the detected current through the crystal 200 can be converted into the detected voltage across the resistor 161. In other words, the resistor 161 is configured to convert the current through the crystal 200 into the voltage across the resistor 161.

As shown in FIG. 5, the envelope tracking circuit 162 is configured to detect an envelope voltage of the voltage across the resistor 161; and the peak detection circuit 163 is configured to detect a peak voltage of the envelope voltage. The hysteresis comparator 164 has two input terminals. A first input terminal of the hysteresis comparator 164 is configured to obtain the envelope voltage detected by the envelope tracking circuit 162, and a second input terminal of the hysteresis comparator 164 is configured to obtain the peak voltage detected by the peak detection circuit 163. An output terminal of the hysteresis comparator 164 is connected to the logic control circuit 165. The hysteresis comparator 164 is configured to output a comparison result to the logic control circuit 165 according to the envelope voltage and the peak voltage. The logic control circuit 165 is configured control the status of the first switch 140 according to the comparison result.

Figure 7:
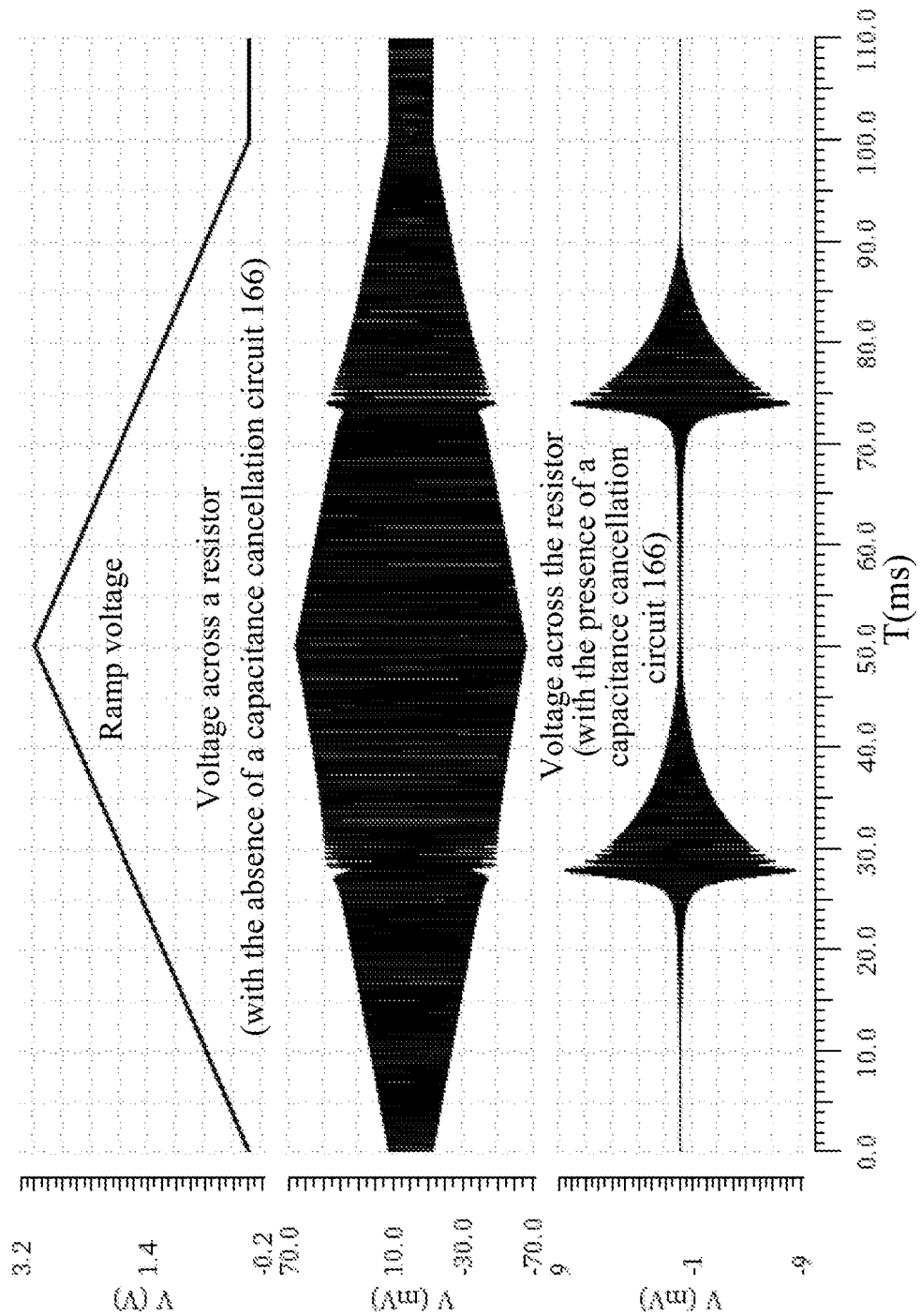
FIG. 7 is a schematic diagram of impact of a shunt capacitor in a crystal on a voltage across a resistor according to an embodiment of the present application.

Optionally, as shown in FIG. 6, the control circuit 160 may further include a capacitance cancellation circuit 166. The capacitance cancellation circuit 166 is configured to cancel a current through a shunt capacitor included in the crystal 200. Specifically, as shown in FIG. 6, a capacitance of the shunt capacitor Cp included in the crystal is equivalent to a resistance that decreases as the frequency increases. Therefore, the higher the frequency, the smaller the resistance of the crystal, and the greater the voltage across the resistor 161. For example, as shown in FIG. 7, when the ramp voltage generating circuit 130 in FIG. 5 and FIG. 6 outputs the ramp voltage, and the capacitance cancellation circuit 166 is not included in FIG. 5, the middle curve in FIG. 7 shows the voltage across the resistor 161. In this case, it is difficult to use the envelope tracking circuit 162, the peak detection circuit 163, and the hysteresis comparator 164 to find a moment at which the envelope voltage decreases, and such detection is error-prone. When the capacitance cancellation circuit 166 is included in FIG. 6, the lower curve in FIG. 7 shows the voltage across the resistor 161. In this case, it is easy to detect the peak voltage of the envelope voltage.

Figure 8:
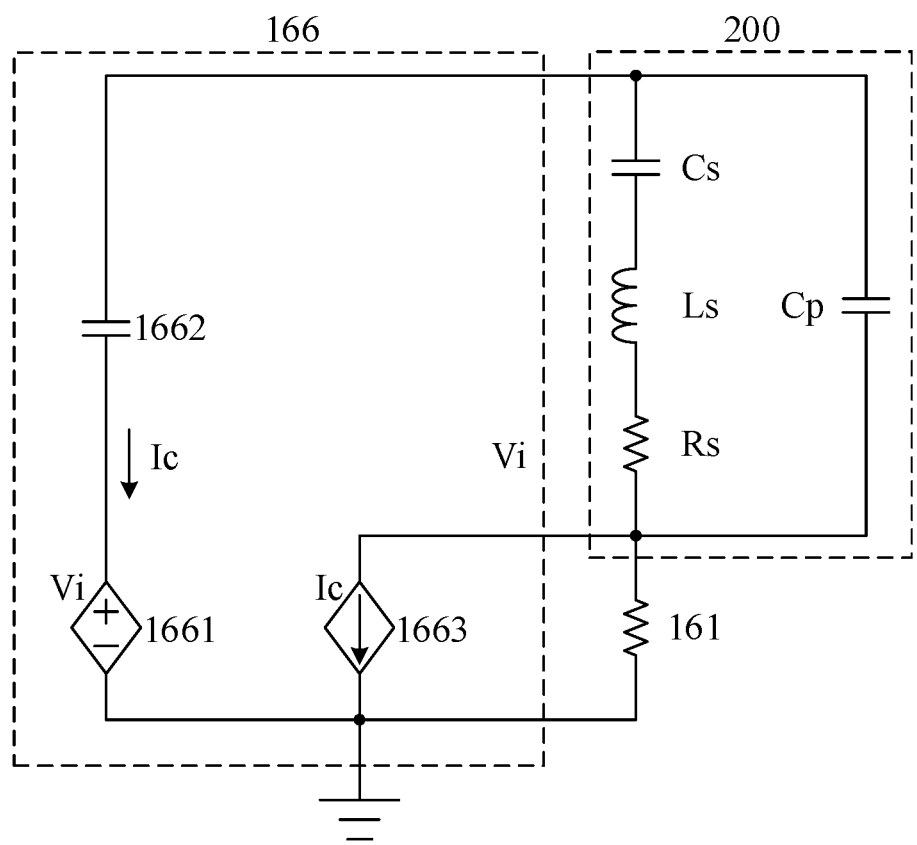
FIG. 8 is a schematic diagram of a capacitance cancellation circuit according to an embodiment of the present application.

The function of the capacitance cancellation circuit 166 in this embodiment of the present application is as follows: A detected voltage across the crystal 200 is divided by a capacitance with the same value as the capacitance of the shunt capacitor included in the crystal 200 to obtain a current. Then, the current passes through a node that connects the resistor 161 and the crystal 200 in series and is used to cancel a current through the shunt capacitor included in the crystal 200. For example, FIG. 8 is a schematic diagram of the capacitance cancellation circuit 166 according to an embodiment of the present application. As shown in FIG. 8, the capacitance cancellation circuit 166 is connected in parallel to the crystal 200. The capacitance cancellation circuit 166 includes a voltage-controlled voltage source 1661 configured to duplicate the voltage across the crystal 200 and output a voltage with the same value as the voltage across the crystal 200; a preset capacitor 1662, where the preset capacitor 1662 is connected in series to the voltage-controlled voltage source 1661, and a capacitance of the preset capacitor 1662 is equal to the capacitance of the shunt capacitor included in the crystal 200; and a current-controlled current source 1663. The current-controlled current source 1663 is connected in series to the preset capacitor 1662. The current-controlled current source 1663 is configured to duplicate a current through the preset capacitor 1662 and output a current with the same value as the current through the preset capacitor 1662 to cancel the capacitance of the shunt capacitor included in the crystal 200.

It should be understood that FIG. 8 is merely an example. The capacitance cancellation circuit 166 may be circuits in other forms used to cancel the capacitance of the shunt capacitor included in the crystal 200. The embodiments of the present application are not limited to thereto.

The following describes the apparatus 100 in this embodiment of the present application in detail with reference to FIG. 6 and FIG. 7. Specifically, as shown in FIG. 7, the ramp voltage generating circuit 130 outputs the ramp voltage that changes over time. Correspondingly, the voltage across the resistor 161 changes over time as the ramp voltage changes. The envelope tracking circuit 162 detects the envelope voltage of the voltage across the resistor 161. A positive envelope voltage is used as an example for description herein. The peak detection circuit 163 is configured to detect the peak voltage of the envelope voltage. For example, the envelope tracking circuit 162 may obtain envelope voltages of the voltage across the resistor 161 at different moments, and the peak detection circuit 163 may obtain peak voltages in different time periods corresponding to the envelope voltages at different moments. For example, a peak voltage corresponding to an envelope voltage at a first moment is a peak voltage in a preset time period before the first moment. Duration of the preset time period may be set according to actual application. The envelope voltage and the peak voltage are sent to the hysteresis comparator 164 for comparison. If the peak voltage is less than or equal to a sum of the envelope voltage and a hysteresis voltage, it indicates that the envelope voltage is increasing or unchanged, and the hysteresis comparator 164 outputs a first value. If the peak voltage is greater than the sum of the envelope voltage and the hysteresis voltage, it indicates that the envelope signal starts to decrease, and the hysteresis comparator 164 outputs a second value. The first value and the second value may be set according to actual application. For ease of description, for example, the first value is "0" and the second value is "1" in this embodiment of the present application.

In other words, a moment at which the hysteresis comparator 164 outputs 1 can be considered as a moment at which the peak voltage appears. The logic control circuit 165 controls the status of the first switch 140 based on a specific timing according to the value output by the hysteresis comparator 164.

Specifically, as shown in FIG. 6 and FIG. 7, the ramp voltage generating circuit 130 outputs the ramp voltage that changes over time. An example in which the ramp voltage generating circuit 130 outputs the voltage that gradually increases from a minimum voltage is used herein. Correspondingly, the voltage across the resistor 161 changes. Before the envelope voltage reaches the peak voltage, that is, before the first moment herein, the hysteresis comparator 164 outputs 0. In this case, the logic control circuit 165 controls the first switch 140 to maintain the on state. In this way, the voltage across the first capacitor 150 increases as the ramp voltage increases, and the control voltage of the voltage-controlled oscillator 120 is equal to the ramp voltage.

At a second moment, the peak voltage of the envelope voltage of the voltage across the resistor appears. The second moment is later than the first moment. When the envelope voltage reaches a maximum value at the second moment, the hysteresis comparator 164 outputs 1. In this case, the logic control circuit 165 controls the first switch 140 to change from the on state to the off state, and the first capacitor 150 records the ramp voltage at the second moment, that is, the voltage across the first capacitor 150 is equal to the ramp voltage at the second moment. At the same time, the control voltage of the voltage-controlled oscillator 120 is switched from the voltage output by the ramp voltage generating circuit 130 to the voltage across the first capacitor 150, and a frequency corresponding to the control voltage is the resonant frequency of the crystal. In other words, the voltage-controlled oscillator 120 outputs the oscillation signal to the crystal 200 at the frequency corresponding to the control voltage, to inject energy into the crystal 200.

Considering that the envelope tracking circuit 162, the peak detection circuit 163, and the hysteresis comparator 164 may cause a delay, and, as shown in FIG. 7, the peak voltage of the corresponding voltage across the resistor 161 appears when the ramp voltage output by the ramp voltage generating circuit 130 gradually increases and when the ramp voltage gradually decreases, a method of detecting the two peak voltages and calculating an average of the two peak voltages can be used to eliminate impact of the delay, thereby improving measurement accuracy.

Figure 9:
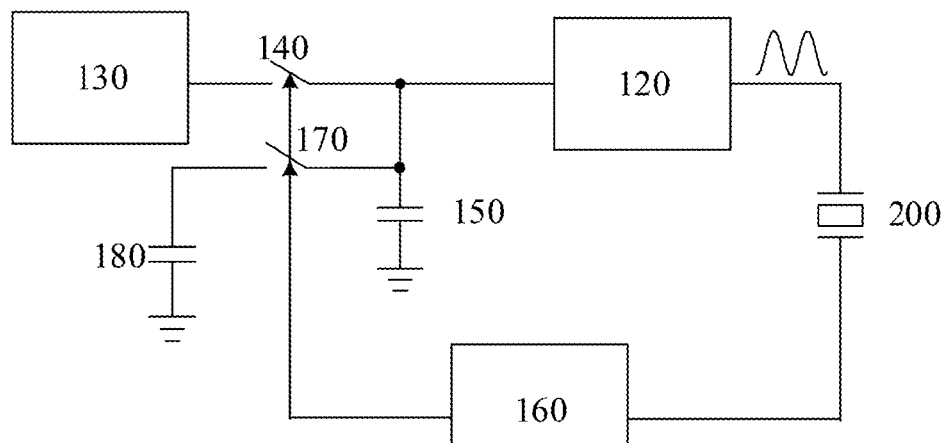
FIG. 9 is a schematic diagram of an apparatus for injecting energy into a crystal in a crystal oscillator according to another embodiment of the present application.

Specifically, as shown in FIG. 9, the apparatus 100 may further include a second switch 170 and a second capacitor 180. The second switch 170 is disposed between the first terminal of the first capacitor 150 and a first terminal of the second capacitor. A second terminal of the second capacitor 180 is grounded. The control circuit 160 controls the statuses of the first switch 140 and the second switch 170 according to the current through the crystal 200. Optionally, the capacitance of the first capacitor 150 and a capacitance of the second capacitor 180 may be set according to actual application, and the capacitance of the first capacitor 150 may be set to be equal to or approximately equal to the capacitance of the second capacitor 180.

Figure 10:
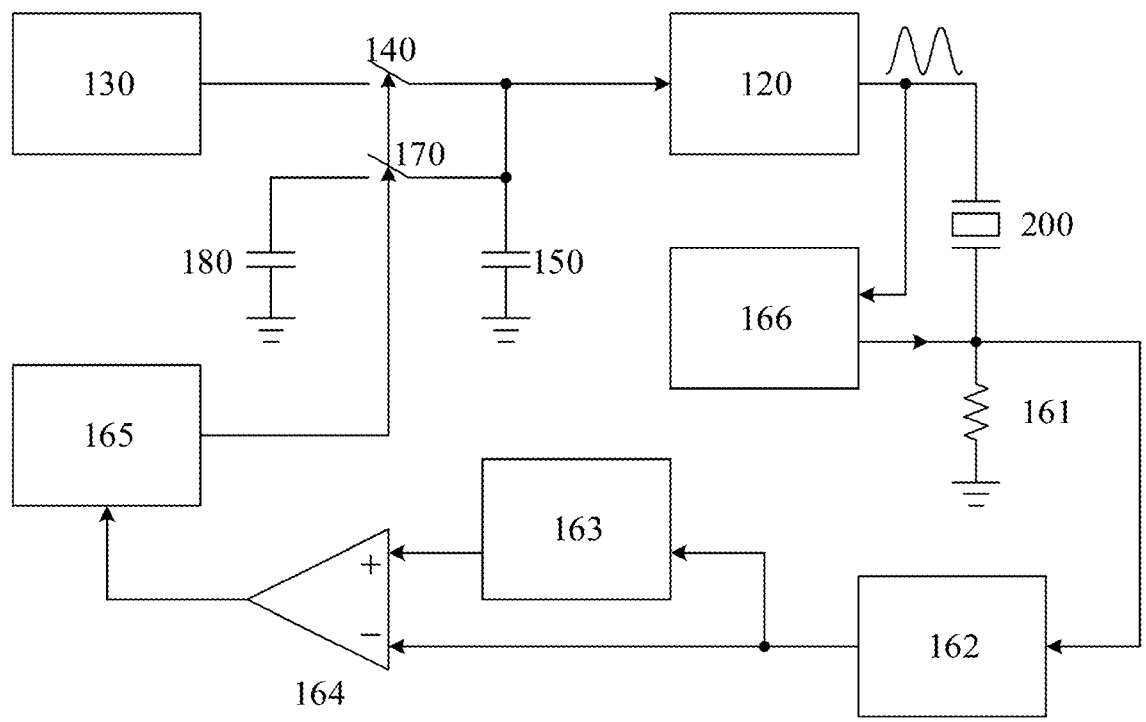
FIG. 10 is a schematic diagram of an apparatus for injecting energy into a crystal in a crystal oscillator according to still another embodiment of the present application.
Figure 11:
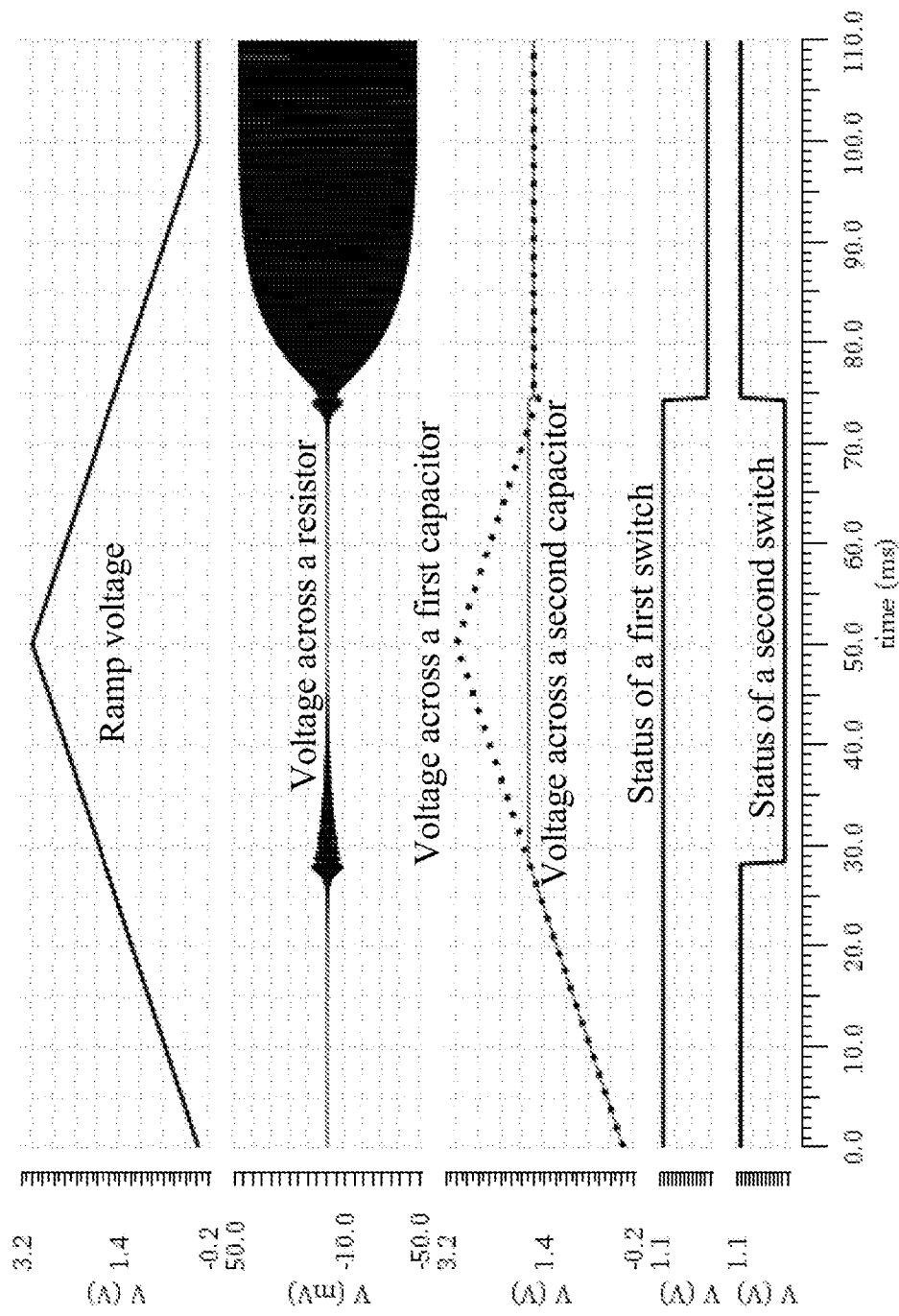
FIG. 11 is a schematic diagram of signals of circuits in an apparatus according to an embodiment of the present application.

The following describes the apparatus 100 that includes two capacitors with reference to FIG. 10 and FIG. 11 by using an example in which the control circuit 160 includes the resistor 161, the envelope tracking circuit 162, the peak detection circuit 163, the hysteresis comparator 164, the logic control circuit 165, and the capacitance cancellation circuit 166.

As shown in FIG. 11, the ramp voltage generating circuit 130 outputs the ramp voltage that changes over time. An example in which the ramp voltage generating circuit 130 outputs the voltage that gradually increases from a minimum voltage is used herein. Correspondingly, the voltage across the resistor 161 changes. Before the envelope voltage reaches the peak voltage, that is, before a third moment herein, the hysteresis comparator 164 outputs 0. In this case, the logic control circuit 165 controls the first switch 140 and the second switch 170 to maintain the on state. In this way, the voltage across the first capacitor 150 and a voltage across the second capacitor 180 both increases as the ramp voltage increases, and the control voltage of the voltage-controlled oscillator 120 is equal to the ramp voltage.

As shown in FIG. 11, at a fourth moment, a first peak voltage of the positive envelope voltage across the resistor 161 appears. The fourth moment is later than the third moment. For example, as shown in FIG. 11, the fourth moment may be the $28^{th}$ ms. When the envelope voltage reaches the peak voltage at the fourth moment, the hysteresis comparator 164 outputs 1. In this case, the logic control circuit 165 controls the first switch 140 to maintain the on state and the second switch 170 to change from the on state to the off state, and the second capacitor 180 records the ramp voltage at the fourth moment, that is, the voltage across the second capacitor 180 is equal to the ramp voltage at the fourth moment. At the same time, the voltage across the first capacitor 150 continues to change as the voltage output by the ramp voltage generating circuit 130 changes.

At a fifth moment, the ramp voltage increases to the maximum value and starts to gradually decrease at a same rate, and a second peak voltage of the positive envelope voltage across the resistor 161 appears. The fifth moment is later than the fourth moment. For example, as shown in FIG. 11, the fifth moment may be the $74^{th}$ ms. At the fifth moment, the hysteresis comparator 164 outputs 1 again. In this case, the logic control circuit 165 controls the first switch 140 to change from the on state to the off state, so that the voltage across the first capacitor 150 no longer changes, and is equal to the second peak voltage. In addition, the logic control circuit 165 controls the second switch 170 to change from the off state to the on state, so that charges of the first capacitor 150 and the second capacitor 180 are redistributed. Assuming that the capacitance of the first capacitor 150 is equal to that of the second capacitor 180, the voltage across the two capacitors is an average of the two peak ramp voltages, and a frequency corresponding to this voltage is the resonant frequency of the crystal. The control voltage of the voltage-controlled oscillator 120 is switched to the average voltage, so that the voltage-controlled oscillator 120 outputs the oscillation signal at the frequency corresponding to the average voltage, to inject energy into the crystal 200.

It should be understood that, as shown in FIG. 11, the control voltage of the voltage-controlled oscillator 120 is switched to the average voltage and maintained for a period of time, and then the crystal 200 is disconnected from the voltage-controlled oscillator 120, so that the voltage-controlled oscillator 120 injects sufficient energy to the crystal 200. Duration of the maintenance period may be set according to actual application. For example, as shown in FIG. 11, as the voltage across the resistor 161 changes, the current through the crystal 200 maintains the maximum value after approximately the $93^{th}$ ms, and the control voltage of the voltage-controlled oscillator 120 is switched to the average voltage at the $74^{th}$ ms. Therefore, the maintenance period after the control voltage of the voltage-controlled oscillator 120 is switched to the average voltage may be set to 10 ms to 30 ms, for example, may be set to 20 ms, 25 ms, or 30 ms. The embodiments of the present application are not limited thereto.

Therefore, in the apparatus for injecting energy into a crystal in a crystal oscillator in the embodiments of the present application, the control circuit detects the current through the crystal, and when the current through the crystal reaches a specific value, controls the control voltage of the voltage-controlled oscillator to switch from the voltage output by the ramp voltage generating circuit to a specific voltage. For example, in the embodiment shown in FIG. 5, the control voltage of the voltage-controlled oscillator is switched from the voltage output by the ramp voltage generating circuit to the voltage across the first capacitor. In the embodiment shown in FIG. 10, the control voltage of the voltage-controlled oscillator is switched from the voltage output by the ramp voltage generating circuit to the average voltage across the first capacitor and the second voltage. In this way, the frequency of the oscillation signal output by the voltage-controlled oscillator is close to the resonant frequency of the crystal, and the energy of the crystal is large enough to improve the startup speed of the crystal oscillator.

A person of ordinary skill in the art may be aware that, in combination with the examples described in the embodiments disclosed in this specification, units and algorithm steps may be implemented by using electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present application.

A person skilled in the art can clearly understand that to describe conveniently and concisely, for a specific working process of the system, apparatus, and unit described above, refer to the corresponding process in the foregoing method embodiments. Details are not described herein again.

In several embodiments provided herein, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electrical, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, function units in the embodiments of the present application may be integrated into one processing unit, or each of the units may exist alone physically, or two or more units are integrated into one unit.

If the function is implemented in the form of software function units and sold or used as independent products, the function may be stored in a computer-readable storage medium. Based on such an understanding, the technical solutions of the present application essentially, or the part contributing to the prior art, or some of the technical solutions may be implemented in a form of a software product. The computer software product is stored in a storage medium, and includes instructions for instructing a computer device (which may be a personal computer, a server, a network device, or the like) to perform all or some of the steps of the methods described in the embodiments of the present application. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementations of the present application, but the protection scope of the present application is not limited thereto. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. An apparatus for injecting energy into a crystal in a crystal oscillator, comprising:
    a voltage-controlled oscillator configured to output an oscillation signal to a crystal in the crystal oscillator;
    a ramp voltage generating circuit configured to generate a ramp voltage that changes over time, so as to control a frequency of the oscillation signal output by the voltage-controlled oscillator;
    a first switch disposed between the ramp voltage generating circuit and the voltage-controlled oscillator;
    a first capacitor, wherein a first terminal of the first capacitor is connected to the first switch and the voltage-controlled oscillator, and a second terminal of the first capacitor is grounded; and
    a control circuit configured to control a status of the first switch according to a current through the crystal, to switch a control voltage of the voltage-controlled oscillator.

2. The apparatus according to claim 1, wherein the control circuit is specifically configured to:
    control the first switch to change from an on state to an off state when the current through the crystal reaches a maximum value.

3. The apparatus according to claim 1, wherein the control circuit comprises:
    a resistor, wherein a first terminal of the resistor is connected to the crystal, a second terminal of the resistor is grounded, and the resistor is configured to convert the current through the crystal into a voltage across the resistor;
    an envelope tracking circuit configured to detect an envelope voltage of the voltage across the resistor;

a peak detection circuit configured to detect a peak voltage of the envelope voltage;

a hysteresis comparator, wherein a first input terminal of the hysteresis comparator is configured to obtain the envelope voltage, a second input terminal of the hysteresis comparator is configured to obtain the peak voltage, an output terminal of the hysteresis comparator is connected to a logic control circuit, and the hysteresis comparator is configured to output a comparison result to the logic control circuit according to the envelope voltage and the peak voltage; and the logic control circuit configured to control the status of the first switch according to the comparison result.

4. The apparatus according to claim 3, wherein the control circuit further comprises:

a capacitance cancellation circuit configured to cancel a current through a shunt capacitor comprised in the crystal.

5. A crystal oscillator, comprising:

the crystal in the apparatus according to claim 1; and an oscillating circuit.

6. The apparatus according to claim 3, wherein the envelope voltage is a positive envelope voltage.

7. The apparatus according to claim 6, wherein if the peak voltage is less than or equal to a sum of the envelope voltage and a hysteresis voltage, the comparison result output by the hysteresis comparator is a first value; or if the peak voltage is greater than a sum of the envelope voltage and a hysteresis voltage, the comparison result output by the hysteresis comparator is a second value.

8. The apparatus according to claim 7, wherein when the first switch is in the on state, the ramp voltage generating circuit starts to output the ramp voltage, and the logic control circuit is configured to:

control the first switch to maintain the on state if the hysteresis comparator outputs the first value at a first moment; and control the first switch to change from the on state to the off state if the hysteresis comparator outputs the second value at a second moment, so that the control voltage of the voltage-controlled oscillator is switched from the ramp voltage to a voltage across the first capacitor, wherein the second moment is later than the first moment.

9. The apparatus according to claim 7, further comprising a second switch and a second capacitor, wherein the second switch is disposed between the first terminal of the first capacitor and a first terminal of the second capacitor, and a second terminal of the second capacitor is grounded; and the logic control circuit is further configured to control a status of the second switch according to the comparison result.

10. The apparatus according to claim 9, wherein a capacitance of the second capacitor is equal to a capacitance of the first capacitor.

11. The apparatus according to claim 10, wherein when the first switch and the second switch are in the on state, the ramp voltage generating circuit starts to output the ramp voltage, and the logic control circuit is configured to:

control the first switch and the second switch to maintain the on state if the hysteresis comparator outputs the first value at a third moment;

control the first switch to maintain the on state and the second switch to change from the on state to the off state if the hysteresis comparator outputs the second value at a fourth moment, wherein the fourth moment is later than the third moment; and control the first switch to change from the on state to the off state and the second switch from the off state to the on state if the hysteresis comparator outputs the second value at a fifth moment, so that the control voltage of the voltage-controlled oscillator is switched from the ramp voltage to an average voltage, wherein the average voltage is an average of a voltage across the first capacitor and a voltage across the second capacitor, the fifth moment is later than the fourth moment, and the first switch is in the on state and the second switch is in the off state from the fourth moment to the fifth moment.

* * * * *